(12) United States Patent
Takei et al.

(10) Patent No.: US 10,392,688 B2
(45) Date of Patent: Aug. 27, 2019

(54) FILM FORMING APPARATUS

(71) Applicant: TOKYO ELECTRON LIMITED, Tokyo (JP)

(72) Inventors: Junichi Takei, Yamanashi (JP); Naoyuki Suzuki, Yamanashi (JP); Tetsuya Miyashita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/832,591

(22) Filed: Dec. 5, 2017

(65) Prior Publication Data

US 2018/0155817 A1    Jun. 7, 2018

(30) Foreign Application Priority Data

Dec. 6, 2016    (JP) ................... 2016-236797

(51) Int. Cl.
| | |
|---|---|
| *C23C 14/04* | (2006.01) |
| *C23C 14/50* | (2006.01) |
| *H01J 37/32* | (2006.01) |
| *C23C 14/00* | (2006.01) |
| *C23C 14/34* | (2006.01) |
| *H01J 37/34* | (2006.01) |
| *H01L 21/677* | (2006.01) |

(52) U.S. Cl.
CPC ...... *C23C 14/0063* (2013.01); *C23C 14/0078* (2013.01); *C23C 14/04* (2013.01); *C23C 14/34* (2013.01); *C23C 14/50* (2013.01); *C23C 14/505* (2013.01); *H01J 37/32357* (2013.01); *H01J 37/32513* (2013.01); *H01J 37/32715* (2013.01); *H01J 37/32871* (2013.01); *H01J 37/3447* (2013.01); *H01L 21/67748* (2013.01)

(58) Field of Classification Search
None
See application file for complete search history.

(56) References Cited

U.S. PATENT DOCUMENTS

2006/0174829 A1* 8/2006 An .................. H01L 21/67173
                                                                 118/52
2007/0095651 A1* 5/2007 Ye .................... C23C 14/225
                                                              204/298.16

(Continued)

FOREIGN PATENT DOCUMENTS

JP    2013-249517    12/2013
JP    2015-067856    4/2015

*Primary Examiner* — Binu Thomas
(74) *Attorney, Agent, or Firm* — Fenwick & West LLP

(57) ABSTRACT

A film forming apparatus includes: a chamber main body defining a chamber; a slit plate partitioning the chamber into a first space and a second space below the first space, the slit plate having a slit penetrating therethrough; a holder holding a target in the first space; a stage for supporting a substrate, the stage being movable in a moving direction perpendicular to a longitudinal direction of the slit in a moving area including an area directly below the slit; and a mechanism for moving the stage along the moving direction. In order to suppress scattering of particles from the target to another area other than the moving area in the second space through the slit, the stage has one or more protruding portions which provide upwardly and/or downwardly bent portions in a path around the stage between the slit and the another area in the second space.

8 Claims, 9 Drawing Sheets

(56) References Cited

U.S. PATENT DOCUMENTS

| | | | |
|---|---|---|---|
| 2009/0098306 A1* | 4/2009 | Druz | C23C 14/221 |
| | | | 427/523 |
| 2013/0299345 A1* | 11/2013 | Abarra | C23C 14/35 |
| | | | 204/298.11 |
| 2014/0141624 A1* | 5/2014 | Abarra | C23C 14/225 |
| | | | 204/298.02 |
| 2015/0187546 A1 | 7/2015 | Furukawa et al. | |
| 2017/0159170 A1* | 6/2017 | Suzuki | C23C 14/54 |

* cited by examiner

FILM FORMING APPARATUS

CROSS-REFERENCE TO RELATED APPLICATIONS

This application claims priority to Japanese Patent Application No. 2016-236797 filed on Dec. 6, 2016, the entire contents of which are incorporated herein by reference.

FIELD OF THE INVENTION

The disclosure relates to a film forming apparatus.

BACKGROUND OF THE INVENTION

In manufacturing electronic devices such as semiconductor devices, a film forming process for forming a film on a substrate is performed. As for a film forming apparatus used for the film forming process, there is known a film forming apparatus disclosed in, e.g., Japanese Patent Application Publication No. 2015-67856.

The film forming apparatus disclosed in Japanese Patent Application Publication No. 2015-67856 performs the film forming process by sputtering. This film forming apparatus includes a vacuum chamber, a substrate supporting table, a target holder and a shield assembly. The substrate supporting table is installed in the vacuum container and mounts a substrate on a mounting surface thereof. The target holder holds a target. The shield assembly is installed between the target holder and the substrate supporting table. The shield assembly has an opening. In this film forming apparatus, particles from the target are released to a space below the shield assembly through the opening. The substrate supporting table moves in one direction below the shield assembly. Accordingly, the particles from the target are incident on the substrate, thereby forming a film on the substrate.

In the film forming apparatus disclosed in Japanese Patent Application Publication No. 2015-67856, the particles from the target are deposited not only on the substrate but also on a wall surface of the vacuum container which defines the space below the shield assembly and components installed in the space. Since it is preferable to suppress unnecessary deposition of the particles from the target on places other than the substrate, it is required to suppress unnecessary scattering of the particles from the target. The film forming apparatus may include a movable shutter (cover plate) to suppress unnecessary deposition of the particles from the target. The film forming apparatus including the movable shutter requires a mechanism for moving the movable shutter as disclosed in Japanese Patent Application Publication No. 2013-249517. Accordingly, the number of components of the film forming apparatus including the movable shutter is increased.

SUMMARY OF THE INVENTION

In accordance with an aspect, there is provided a film forming apparatus for forming a film on a substrate. The film forming apparatus includes a chamber main body, a slit plate, a holder, a stage and a moving mechanism. The chamber main body defines a chamber therein. The slit plate partitions the chamber into a first space and a second space below the first space. A slit is formed in the slit plate to penetrating through the slit plate. The holder is configured to hold a target in the first space. The stage is configured to support a substrate. The stage is movable in a moving direction perpendicular to a longitudinal direction of the slit in a moving area including an area directly below the slit. The moving mechanism is configured to move the stage along the moving direction. In order to suppress scattering of particles from the target to another area other than the moving area in the second space through the slit, the stage has one or more protruding portions which provide upwardly and/or downwardly bent portions in a path around the stage between the slit and the another area in the second space.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
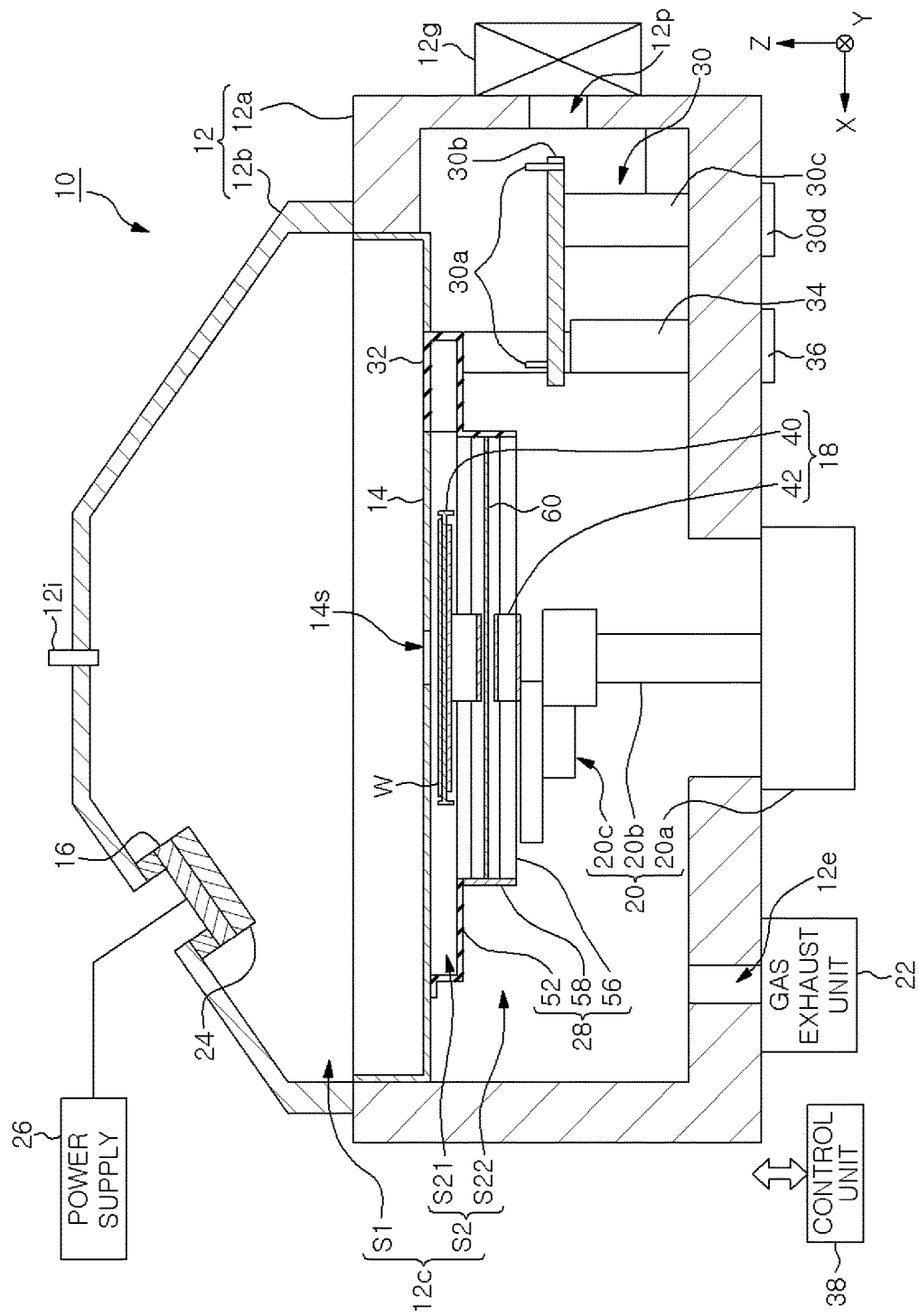
FIG. 1 schematically shows a film forming apparatus according to an embodiment.

Hereinafter, embodiments will be described in detail with reference to the accompanying drawings. Like reference numerals will be given to like or corresponding parts throughout the drawings.

Figure 2:
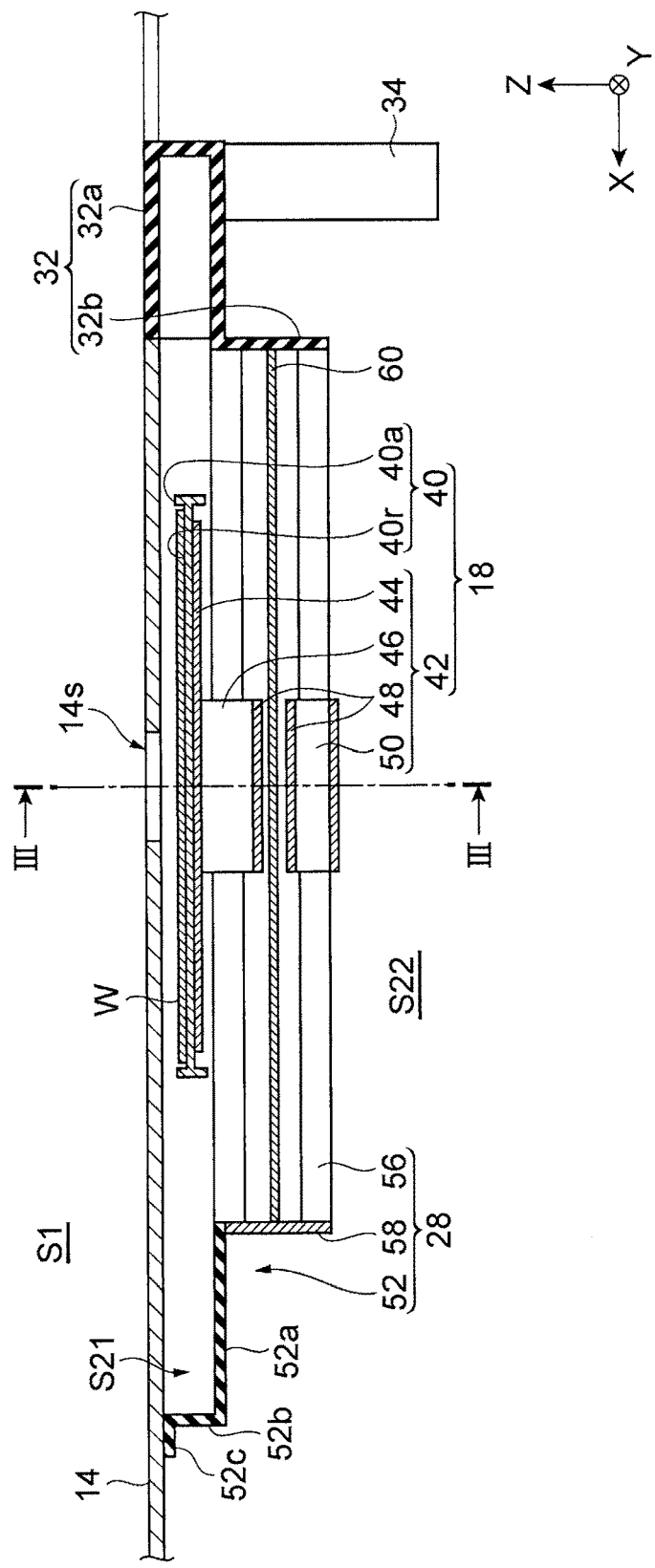
FIG. 2 is an enlarged view showing a part of the film forming apparatus shown in FIG. 1.
Figure 3:
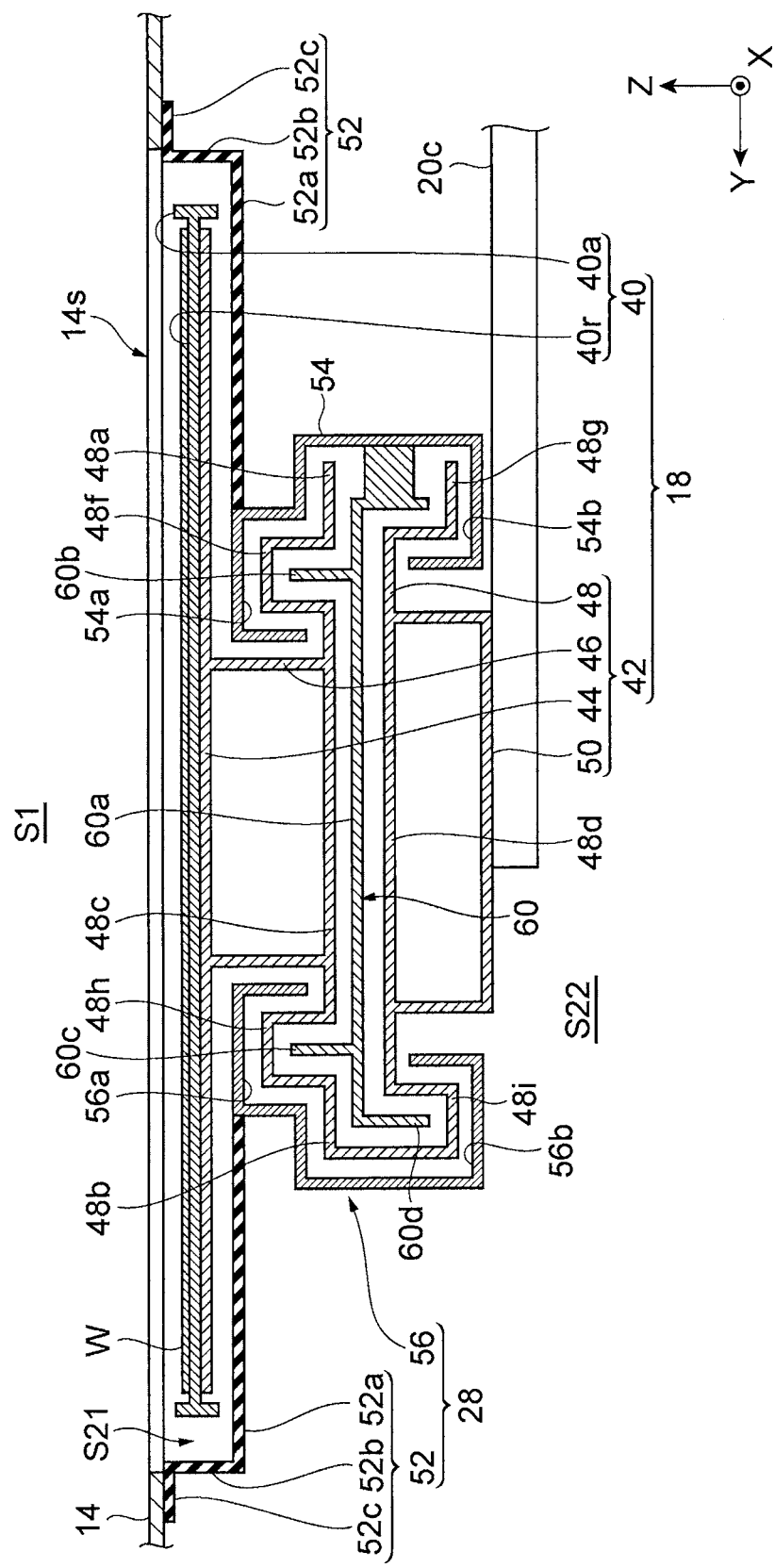
FIG. 3 is a cross sectional view showing a part of the film forming apparatus which is taken along a line III-III of FIG. 2.

FIG. 1 schematically shows a film forming apparatus according to an embodiment. In FIG. 1, a partial sectional view of a film forming apparatus 10 according to an embodiment is illustrated. FIG. 2 is an enlarged view showing a part of the film forming apparatus shown in FIG. 1. FIG. 3 is a cross sectional view showing a part of the film forming apparatus which is taken along a line III-III of FIG. 2. The film forming apparatus 10 forms a film on a substrate by sputtering. The film forming apparatus 10 includes a chamber main body 12, a slit plate 14, a holder 16, a stage 18 and a moving mechanism 20.

An inner space of the chamber main body 12 serves as a chamber 12c. In one embodiment, the chamber main body 12 includes a main body 12a and a cover 12b. The main body 12a may have a substantially cylindrical shape. The main body 12a has an upper opening. The cover 12b is provided on an upper end of the main body 12a to close the upper opening of the main body 12a.

A gas exhaust port 12e is formed at a bottom portion of the chamber main body 12. A gas exhaust unit 22 is connected to the gas exhaust port 12e. The gas exhaust unit 22 may include a pressure control unit and a vacuum pump such as a turbo molecular pump or a dry pump. An opening 12p is formed at a sidewall of the chamber main body 12. A substrate W is loaded into the chamber 12c or unloaded from the chamber 12c through the opening 12p. The opening 12p can be opened and closed by a gate valve 12g. A gas inlet port 12i for introducing a gas into the chamber 12c is formed at the chamber main body 12. A gas, e.g., an inert gas, from a gas supply unit is introduced into the chamber 12c through the gas inlet port 12i.

A slit plate 14 is provided in the chamber 12c. The slit plate 14 is a substantially plate-shaped member. The slit plate 14 extends horizontally at a substantially middle position in a height direction of the chamber 12c. A peripheral portion of the slit plate 14 is fixed to the chamber main body 12. The slit plate 14 partitions the chamber 12c into a first space S1 and a second space S2. The first space S1 is a part of the chamber 12c positioned above the slit plate 14. The second space S2 is the other part of the chamber 12c positioned below the slit plate 14.

A slit 14s is formed in the slit plate 14. The slit 14s penetrates through the slit plate 14 in a plate thickness direction thereof (Z direction in the drawing). The slit plate 14 may be formed of a single component or a plurality of components. When the film formation is performed by the film forming apparatus 10, the substrate W moves in an X direction under the slit 14s. The X direction is one horizontal direction. The slit 14s extends in another horizontal direction, i.e., in a Y direction. The slit 14s has, e.g., a substantially rectangular shape when seen from the top. The Y direction is a longitudinal direction of the slit 14s and perpendicular to the X direction. The center of the slit 14s in the Y direction substantially coincides with the center of the substrate W in the Y direction during the film formation. A length of the slit 14s in the Y direction is longer than a width (maximum width) of the substrate W in the Y direction during the film formation. A width of the slit 14s in the X direction is smaller than a width (maximum width) of the substrate W in the X direction during the film formation.

The holder 16 is provided above the slit plate 14. The holder 16 is made of a conductive material. The holder 16 is attached to the chamber main body 12 through an insulating member. In one embodiment, the holder 16 is attached to the cover 12b through an insulating member.

The holder 16 is configured to hold the target 24 in the first space S1. In one embodiment, the holder 16 holds the target 24 such that the target 24 is inclined with respect to the slit 14s. The target 24 has, e.g., a substantially rectangular shape in a plan view. In one embodiment, a width of the target 24 in the Y direction is greater than a width (maximum width) of the substrate W in the Y direction during the film formation.

A power supply 26 is electrically connected to the holder 16. When the target 24 is made of a metallic material, a DC power supply may be used as the power supply 26. When the target 24 is made of a dielectric material or an insulator, the power supply 26 is electrically connected to the holder 16 via a matching unit.

The stage 18 supports the substrate W in the chamber 12c. The stage 18 is movable. During the film formation, the stage 18 moves along a moving direction, i.e., in the X direction, in a moving area S21. The moving area S21 is included in the second space S2. The moving area S21 includes a space directly below the slit 14s and a space directly below the slit plate 14. The stage 18 has one or more block portions in order to suppress scattering of particles from the target 24 to another area S22 other than the moving area S21 in the second space S2 through the slit 14s. One or more block portions of the stage 18 provide upwardly and/or downwardly bent portions in a path around the stage 18 between the slit 14s and the area S22. In other words, the stage 18 provides a labyrinth path around the stage 18 between the slit 14s and the area S22.

In one embodiment, the moving area S21 is defined by a wall member 28 to be described later. The wall member 28 extends on a boundary between the moving area S21 and another area S22 other than the moving area S21 in the second space S2. The wall member 28 and the stage 18 form a path between the slit 14s and the area S22. A bent narrow path, i.e., a labyrinth path, is formed between the slit 14s and the area S22 by the wall member 28 and the stage 18.

The stage 18 is coupled to the moving mechanism 20. The moving mechanism 20 is configured to move the stage 18. In one embodiment, the moving mechanism 20 includes a driving device 20a, a driving shaft 20b and a multi-joint arm 20c.

The driving device 20a is provided at the outside of the chamber main body 12. For example, the driving device 20a is attached to the bottom portion of the chamber main body 12. A lower end portion of the driving shaft 20b is connected to the driving device 20a. In the chamber 12c, the driving shaft 20b extends upward from the driving device 20a. The driving device 20a generates a driving force for vertically moving and rotating the driving shaft 20b. The driving device 20a is, e.g., a motor.

One end portion of the multi-joint arm 20c is rotatably supported at an upper end portion of the driving shaft 20b. The other end portion of the multi-joint arm 20c is coupled to the stage 18. When the driving shaft 20b is rotated by the driving device 20a, the other end portion of the multi-joint arm 20c moves linearly along the X direction. Accordingly, the movement of the stage 18 in the moving area S21 is realized. When the driving shaft 20b is vertically moved by the driving device 20a, the multi-joint arm 20c and the stage 18 are vertically moved.

A substrate lift-up mechanism 30 is provided in an area near the opening 12p in the area S22 of the second space S2. The substrate lift-up mechanism 30 includes a plurality of lift pins 30a, a supporting member 30b, a driving shaft 30c and a driving device 30d. The lift pins 30a have a cylindrical shape extending in a vertical direction. Upper ends of the lift pins 30a are positioned at substantially the same height in the vertical direction. The number of the lift pins 30a is, e.g., three. The lift pins 30a are supported at the supporting member 30b. The supporting member 30b has a substantially horseshoe shape. The lift pins 30a extend upward from the supporting member 30b. The supporting member 30b is supported by the driving shaft 30c. The driving shaft 30c extends downward from the supporting member 30b and is connected to the driving device 30d. The driving device 30d generates a driving force for vertically moving the lift pins 30a. The driving device 30d is, e.g., a motor.

The substrate lift-up mechanism 30 allows the substrate W to be received on the upper ends of the lift pins 30a from a transfer unit before the substrate W, loaded from the outside of the chamber main body 12 into the chamber 12c, is mounted on the stage 18 by the transfer unit. Further, the substrate lift-up mechanism 30 allows the substrate W to be received on the upper ends of the lift pins 30a from the stage 18 when unloading the substrate W to the outside of the chamber main body 12. Although a plurality of through-holes into which the lift pins 30a are inserted is formed in the stage 18, the illustration of the through-holes is omitted in the drawings.

The wall member 28 has an opening at one end in the X direction. The stage 18 enters the moving area S21 through the opening at one end in the X direction of the wall member 28 during movement from the area S22 to the moving area S21. The stage 18 passes through the opening at one end in the X direction of the wall member 28 also during retreat movement from the moving area S21 to the area S22.

The film forming apparatus 10 further includes a cover unit 32 for opening/closing the opening at one end of the wall member 28. The cover unit 32 is supported by a driving shaft 34. The driving shaft 34 extends downward from the cover unit 32 and is connected to a driving device 36. The driving device 36 generates a driving force for vertically moving the cover unit 32. The driving device 36 is, e.g., a motor. The cover unit 32 can be retreated to the first space S1 by the driving device 36. The slit plate 14 has an opening through which the cover unit 32 passes during retreat movement from the second space S2 to the first space S1. When the opening at one end of the wall member 28 is blocked by the cover unit 32, the opening of the slit plate 14 is also blocked. The components such as the slit plate 14, the cover unit 32, the driving device 36 and the like may be configured such that the opening at one end in the X direction of the wall member 28 is opened/closed by moving the cover unit 32 in the Y direction or may be configured such that the opening at one end in the X direction of the wall member 28 is opened/closed by moving the cover unit 32 in the X direction.

The film forming apparatus 10 may further include a control unit 38. The control unit 38 may be a computer device including a processor, a storage unit such as a memory or the like, a control signal output interface, an input device such as a keyboard or the like, a display device such as a display or the like, and the like. The control unit 38 transmits control signals to the components of the film forming apparatus 10 and controls the components. The control unit 38 controls, e.g., a driving system such as the driving devices 20a, 30d and 36, a gas supply system for supplying a gas to the gas inlet port 12i, the gas exhaust unit 22, and a power supply system such as the power supply 26 or the like.

Figure 4:
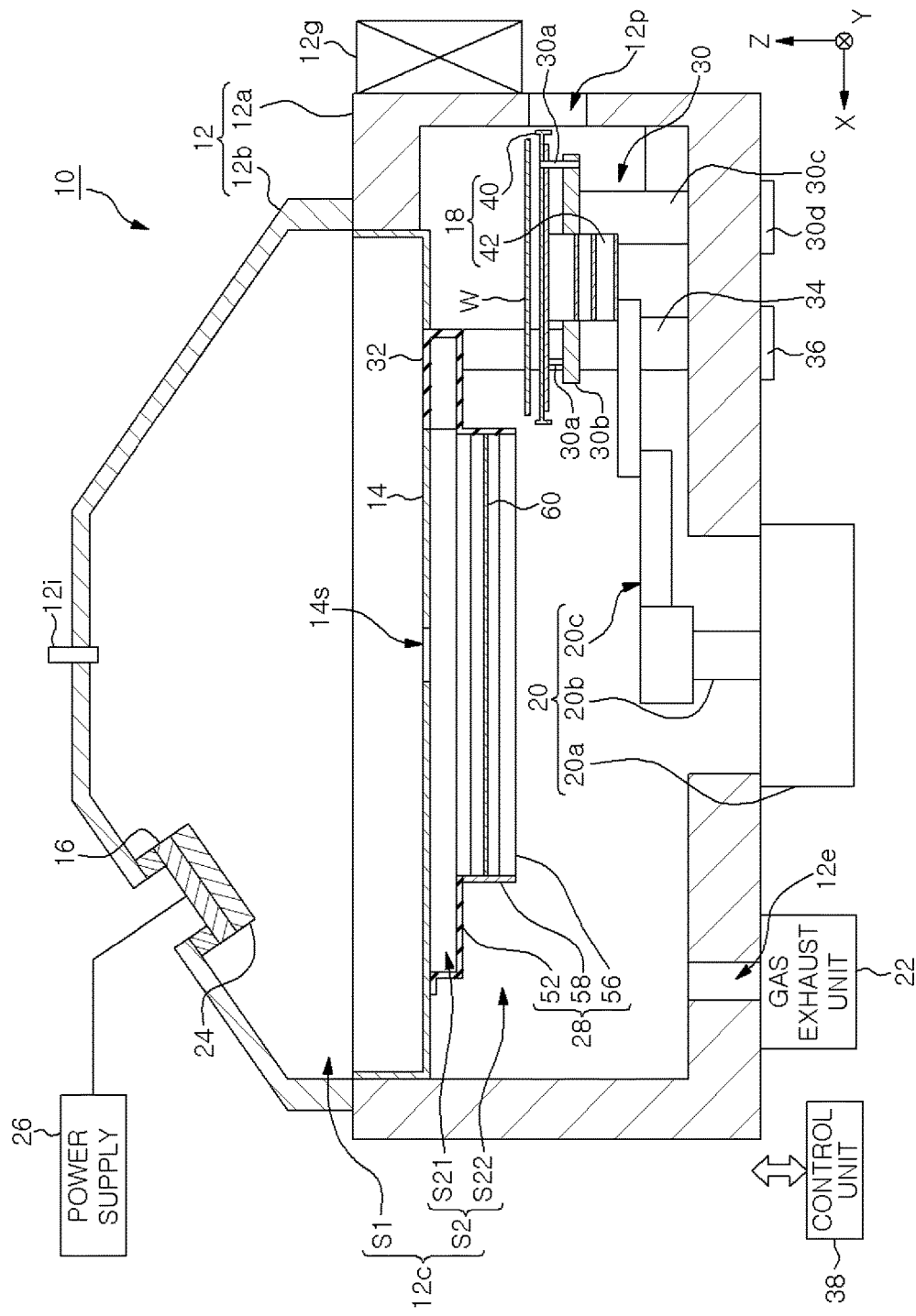
FIG. 4 schematically shows a state in which a substrate is loaded in the film forming apparatus according to the embodiment.
Figure 5:
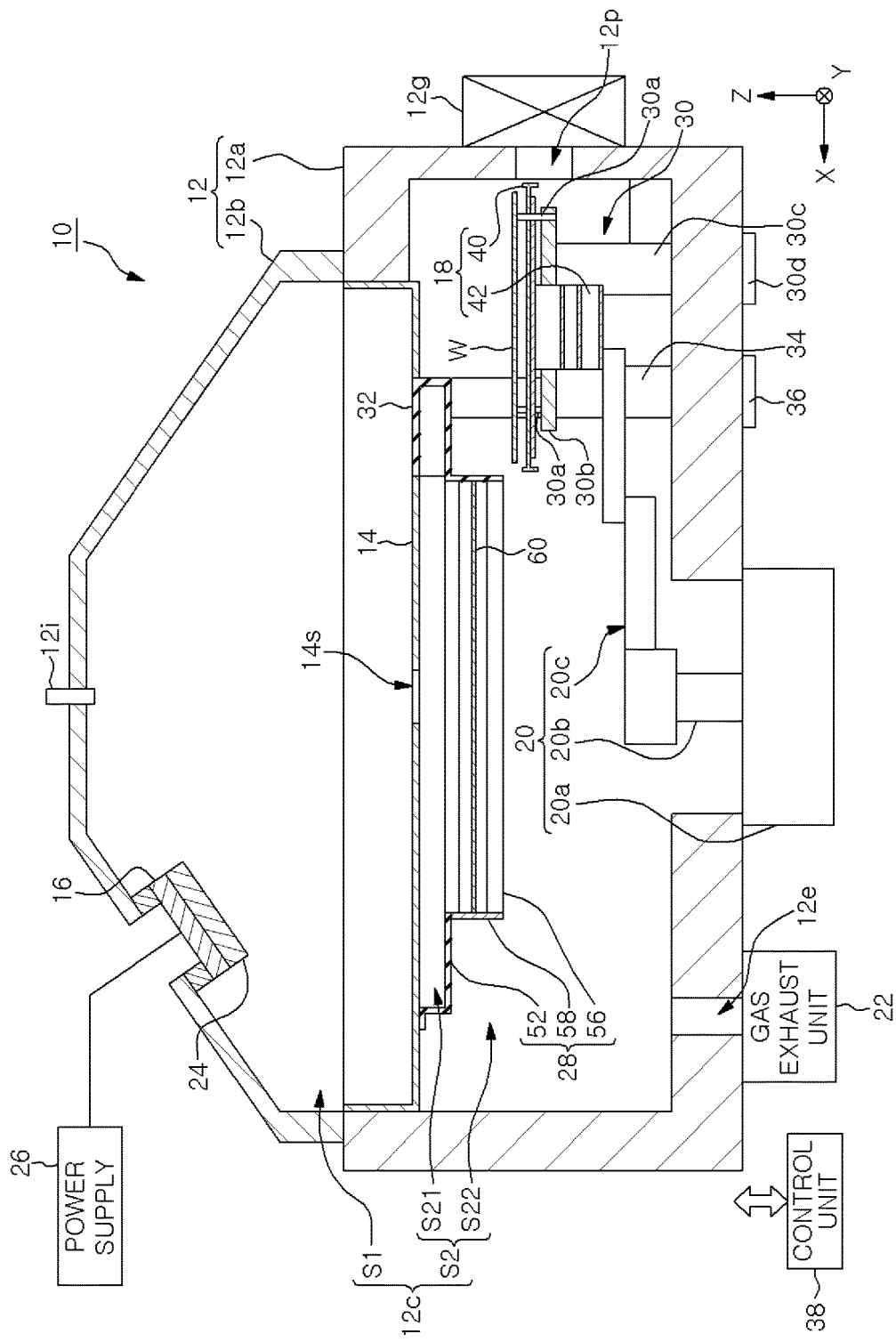
FIG. 5 schematically shows a state in which the substrate is supported by lift pins in the film forming apparatus according to the embodiment.
Figure 6:
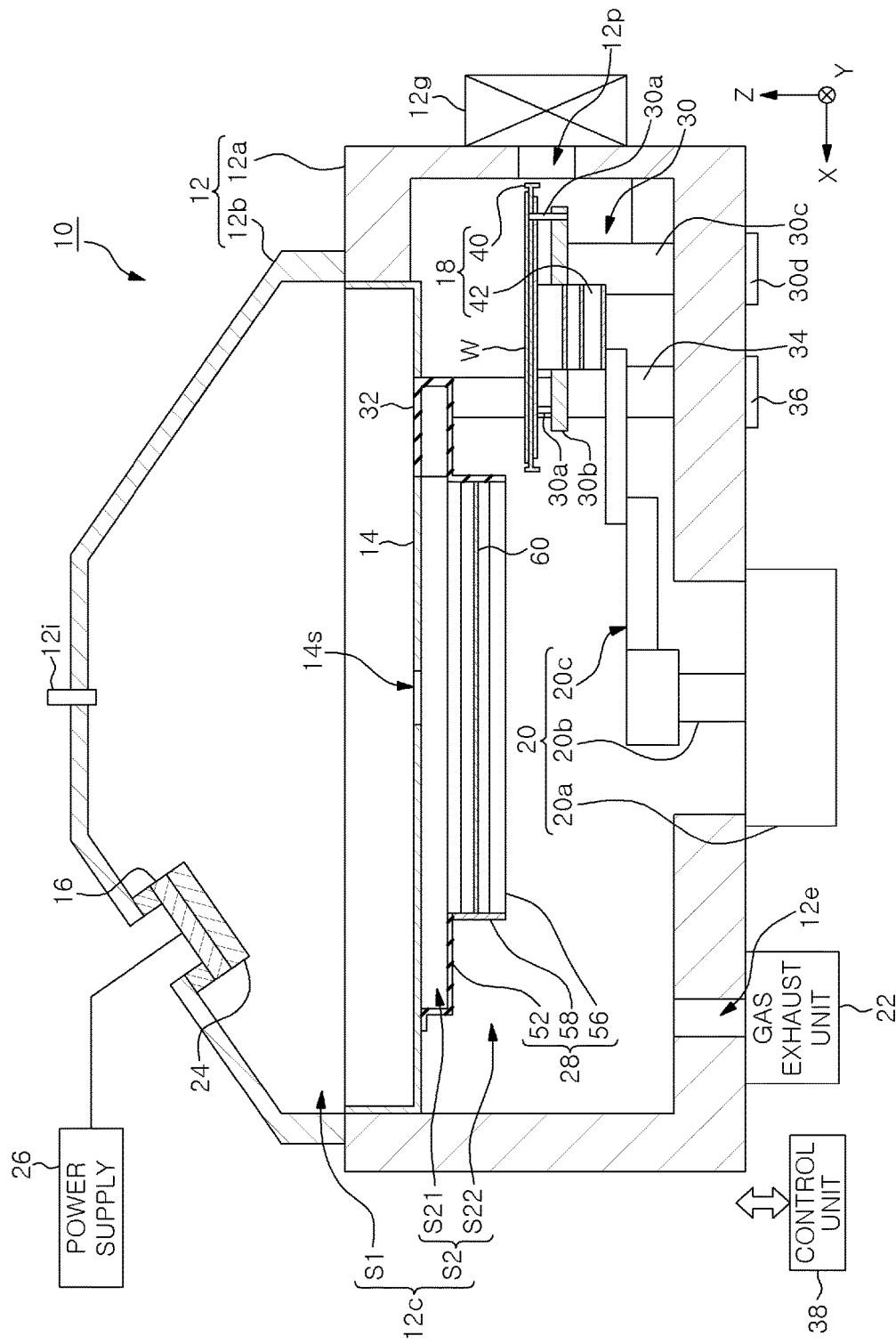
FIG. 6 schematically shows a state in which the substrate is mounted on a stage in the film forming apparatus according to the embodiment.
Figure 7:
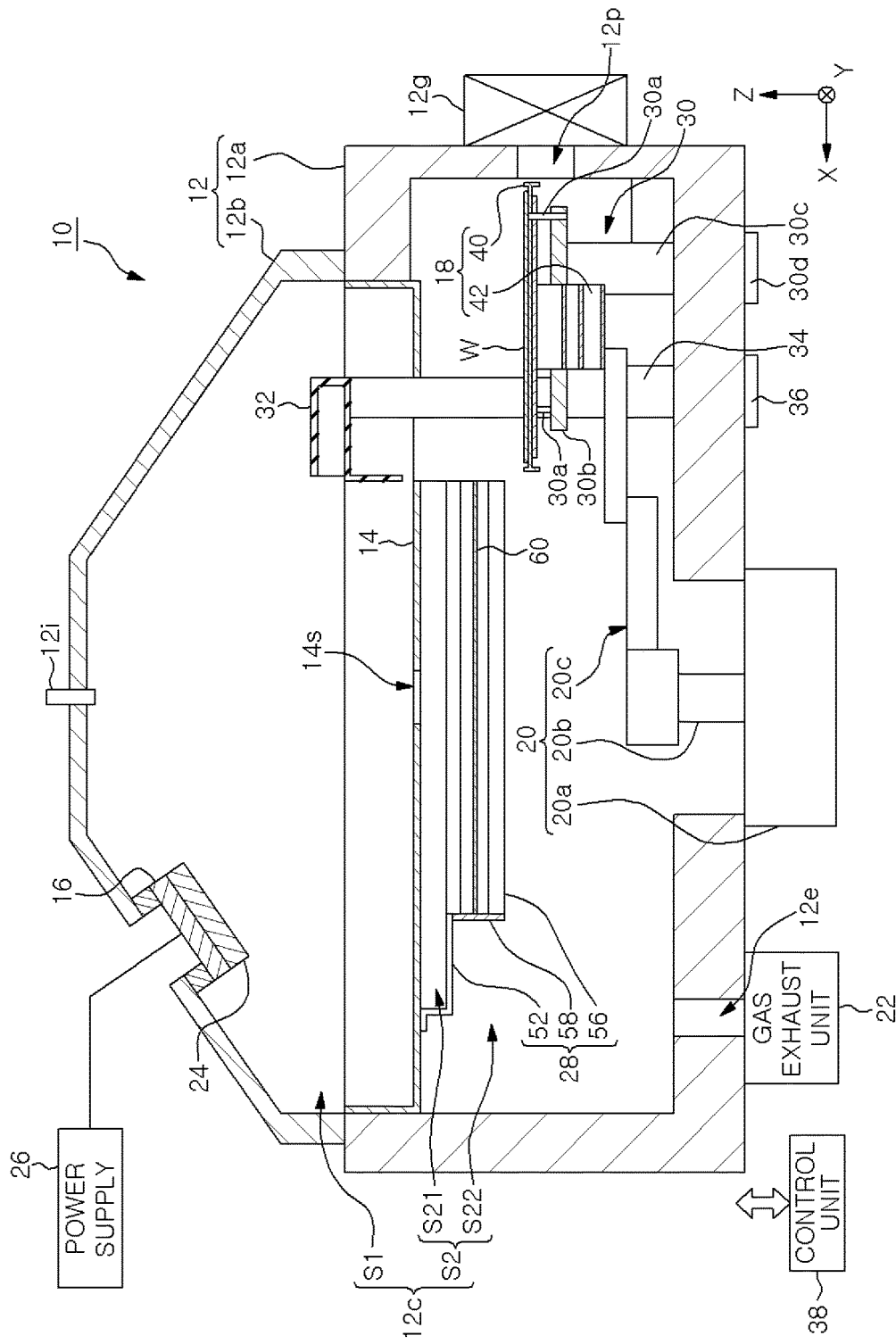
FIG. 7 schematically shows a state in which a cover unit is moved upward so that the substrate can be positioned in a moving area in the film forming apparatus according to the embodiment.

Hereinafter, the operation of the film forming apparatus 10 will be described with reference to FIGS. 1 and 4 to 7. FIG. 4 schematically shows a state in which a substrate is loaded in the film forming apparatus according to the embodiment. FIG. 5 schematically shows a state in which the substrate is supported by the lift pins in the film forming apparatus according to the embodiment. FIG. 6 schematically shows a state in which the substrate is mounted on the stage in the film forming apparatus according to the embodiment. FIG. 7 schematically shows a state in which the cover unit is moved upward so that the substrate can be positioned in the moving area in the film forming apparatus according to the embodiment.

When operating the film forming process, first, the opening 12p is opened by the gate valve 12g. Then, as shown in FIG. 4, the substrate W is loaded into the chamber 12c from the outside of the chamber main body 12. The substrate W is loaded by a transfer unit of a transfer module connected to the film forming apparatus 10. When the substrate W is loaded, the lift pins 30a and the stage 18 are retreated to a position below an area where the substrate W is to be loaded in order to avoid interference with the substrate W.

Next, as shown in FIG. 5, the lift pins 30a are moved upward and the substrate W is delivered from the transfer unit of the transfer module to the lift pins 30a. At this time, the substrate W is supported on the upper ends of the lift pins 30a. After the substrate W is supported by the lift pins 30a, the transfer unit of the transfer module is retreated from the chamber 12c to the outside of the chamber main body 12. Then, the opening 12p is closed by the gate valve 12g.

Thereafter, as shown in FIG. 6, the stage 18 is moved upward and the substrate W is delivered from the lift pins 30a to the stage 18. Next, as shown in FIG. 7, the cover unit 32 is moved upward and retreated to the first space S1. Then, as shown in FIG. 1, the stage 18 is moved into the moving area S21 and the opening at one end of the wall member 28 is blocked by the cover unit 32.

Next, a gas is introduced into the chamber 12c through the gas inlet port 12i and a pressure in the chamber 12c is set to a predetermined level by the gas exhaust unit 22. A voltage from the power supply 26 is applied to the holder 16. When the voltage is applied to the holder 16, the gas in the chamber 12c is dissociated and ions collide with the target 24. When the ions collide with the target 24, particles of a material forming the target 24 are released from the target 24. The particles released from the target 24 are deposited on the substrate W after passing through the slit 14s. Since the substrate W is moved in the X direction as described above, a film made of the material forming the target 24 is formed on a top surface of the substrate W.

Hereinafter, the stage 18, the wall member 28 and the cover unit 32 will be described in detail with reference to FIGS. 1 to 3. First, the stage 18 will be described in detail. In one embodiment, the stage 18 includes a mounting portion 40 and a supporting portion 42. The mounting portion 40 has, e.g., a substantially plate shape extending in the X direction and the Y direction. The mounting portion 40 has a mounting region 40r on a top surface thereof. The mounting region 40r mounts thereon the substrate W. In one embodiment, the mounting portion 40 may have a protruding portion 40a. The protruding portion 40a protrudes further upward than the mounting region 40r to surround the mounting region 40r.

The supporting portion 42 is disposed below the mounting portion 40. The supporting portion 42 supports the mounting portion 40. The supporting portion 42 includes an upper portion 44, a connecting portion 46, a hollow portion 48 and a lower portion 50. The upper portion 44 has a substantially flat plate shape and extends in the X direction and the Y direction. The mounting portion 40 is fixed to the upper portion 44 in a state where a bottom surface of the mounting portion 40 is in contact with a top surface of the upper portion 44.

The connecting portion 46 extends from a bottom surface of the upper portion 44 and is connected to the hollow portion 48. In one embodiment, the connecting portion 46 has a pair or flat plate portions. Each of the flat plate portions has a flat plate shape and extends in the X direction and a Z direction. Upper ends of the flat plate portions of the connecting portion 46 are connected to the bottom surface of the upper portion 44. Lower ends of the flat plate portions of the connecting portion 46 are connected to the hollow portion 48.

The hollow portion 48 has a hollow shape. In one embodiment, the hollow portion 48 is formed as a plate bent at multiple locations, the plate extending on a boundary between an inner space and an outer side of the hollow portion 48. When the stage 18 is positioned in the moving area S21, a shield member 60 to be described later is positioned in the inner space of the hollow portion 48. The hollow portion 48 has openings at both ends in the X direction.

The hollow portion 48 has two peripheral portions 48a and 48b at both sides in the Y direction. The two peripheral portions 48a and 48b extend in the X direction. The peripheral portion 48a provides an opening toward the outer side in the Y direction. The opening of the peripheral portion 48a communicates with the inner space of the hollow portion 48. The peripheral portion 48b blocks the inner space of the hollow portion 48.

The hollow portion 48 has two flat plate portions 48c and 48d. The flat plate portions 48c and 48d are formed between the peripheral portions 48a and 48b and extend in the X direction and the Y direction. The flat plate portions 48c and 48d are formed substantially in parallel with each other. The flat plate portion 48c is spaced upward from the flat plate portion 48d. A lower end of the connecting portion 46 is connected to the flat plate portion 48c.

The peripheral portion 48a provides protruding portions 48f and 48g (first protruding portions). The peripheral portion 48b provides protruding portions 48h and 48i (first protruding portions). The protruding portions 48f and 48h are formed at opposite sides of the flat plate portion 48c in the Y direction. The protruding portions 48f and 48h protrude further upward than the flat plate portion 48c and extend in the X direction. The protruding portions 48g and 48i are formed at opposite sides of the flat plate portion 48d in the Y direction. The protruding portions 48g and 48i protrude further downward than the flat plate portion 48d and extend in the X direction.

The lower portion 50 is connected to a bottom surface of the flat plate portion 48d. The lower portion 50 and the flat plate portion 48d form a tube-shaped portion opened at opposite ends in the X direction. The other end portion of the multi-joint arm 20c of the moving mechanism 20 is coupled to the lower portion 50.

Hereinafter, the wall member 28 will be described in detail. As described above, the wall member 28 extends on the boundary between the moving area S21 and the area S22 and defines the moving area S21. The wall member 28 includes a first member 52, second members 54 and 56 and a third member 58.

The first member 52 defines an area for movement of the mounting portion 40 and the upper portion 44 of the supporting portion 42 in the moving area S21. In one embodiment, the first member 52 is formed as a plate bent at multiple locations. The first member 52 has a bottom portion 52a, an intermediate portion 52b and an upper portion 52c. The first member 52 provides at one end in the X direction an opening that is opened and closed by a part of the cover unit 32. The bottom portion 52a is spaced downward from the slit plate 14 and extends in the X direction and the Y direction. An opening is formed in the bottom portion 52a. When the stage 18 is positioned in the moving area S21, the connecting portion 46 of the supporting portion 42 of the stage 18 is positioned at the opening of the bottom portion 52a. The intermediate portion 52b extends upward from the edge of the bottom portion 52a except for one end in the X direction. The upper end portion 52c extends from the upper end of the intermediate portion 52b in a flange shape and is coupled to the slit plate 14.

The second member 54 surrounds the peripheral portion 48a such that a small gap is ensured between the second member 54 and the peripheral portion 48a of the hollow portion 48. Specifically, the second member 54 surrounds the protruding portions 48f and 48g. In one embodiment, the second member 54 is formed as a plate bent at multiple locations. The second member 54 provides recesses 54a and 54b (first recesses). The protruding portion 48f of the stage 18 is inserted into the recess 54a. The protruding portion 48g of the stage 18 is inserted into the recess 54b. The second member 56 surrounds the peripheral portion 48b such that a small gap is ensured between the second member 56 and the peripheral portion 48b of the hollow portion 48. Specifically, the second member 56 surrounds the protruding portions 48h and 48i. In one embodiment, the second member 56 is formed as a plate bent at multiple locations. The second member 56 provides recesses 56a and 56b (first recesses). The protruding portion 48h of the stage 18 is inserted into the recess 56a. The protruding portion 48i of the stage 18 is inserted into the recess 56b.

Upper portions of the second members 54 and 56 have a flat plate shape extending in the X direction and the Y direction. The upper portions of the second members 54 and 56 are positioned in the opening of the bottom portion 52a of the first member 52. The upper portions of the second members 54 and 56 are coupled to an end surface that defines the opening of the bottom portion 52a of the first member 52.

The second members 54 and 56 are spaced apart from each other in the Y direction. When the stage 18 is positioned in the moving area S21, the connecting portion 46 of the supporting portion 42 of the stage 18 is positioned between the upper portion of the second member 54 and the upper portion of the second member 56. When the stage 18 is positioned in the moving area S21, the lower portion 50 of the supporting portion 42 of the stage 18 is positioned between the lower portion of the second member 54 and the lower portion of the second member 56.

The second members 54 and 56 have openings at opposite ends in the X direction. The opening at one end in the X direction of each of the second members 54 and 56 is a part of the opening at one end in the X direction of the wall member 28. A third member 58 is coupled to the other ends in the X direction of the second members 54 and 56 to block the other end in the X direction of the moving area S21.

As described above, the opening at one end in the X direction of the wall member 28 can be opened and closed by the cover unit 32. In one embodiment, the cover unit 32 has an upper portion 32a and a lower portion 32b. The upper portion 32a has a box shape. The upper portion 32a provides an opening so that an inner space thereof communicates with the moving area S21 when one end in the X direction of the moving area S21 is blocked by the cover unit 32. The lower portion 32b extends downward from an end portion of the upper portion 32a which defines the opening. When one end in the X direction of the moving area S21 is blocked by the cover unit 32, the lower portion 32b blocks the openings at one ends in the X direction of the second members 54 and 56 and the opening between one end in the X direction of the second member 54 and one end in the X direction of the second member 56. In one embodiment, the lower portion 32b of the cover unit 32 has a flat plate shape extending in the Y direction and the Z direction.

In one embodiment, the film forming apparatus 10 may further include the shield member 60. The shield member 60 is provided in the moving area S21. When the stage 18 is positioned in the moving area S21, the shield member 60 is partially positioned in the inner space of the hollow portion 48 of the stage 18. The shield member 60 includes a flat plate portion 60a extending substantially in parallel with the slit 14s. The flat plate portion 60a extends in the X direction and the Y direction.

In one embodiment, the shield member 60 further includes protrusions 60b to 60d. The protrusions 60b and 60c are formed at opposite sides in the Y direction of the flat plate portion 60a and protrude upward from the flat plate portion 60a. The protrusion 60d is formed at an outer side of the protrusion 60c in the Y direction and protrudes downward from the flat plate portion 60a. The protrusions 60b to 60d have a flat plate shape extending in the X direction and the Z direction. The shield member 60 is fixed to the second member 54 at an end portion that is opposite to the protrusion 60d in the X direction. When the stage 18 is positioned in the moving area S21, the protrusion 60b is partially positioned in the inner space of the protruding portion 48f. When the stage 18 is positioned in the moving area S21, the protrusion 60c is partially positioned in the inner space of the protruding portion 48h. When the stage 18 is positioned in the moving area S21, the protrusion 60d is partially positioned in the inner space of the protruding portion 48i.

In the film forming apparatus 10, by the protruding portions 48f, 48g, 48h and 48i formed at the stage 18, the path around the stage 18 between the slit 14s and the area S22 other than the moving area S21 in the second space S2 is bent to form the labyrinth path. Accordingly, the scattering of particles from the target 24 to the area S22 is suppressed and unnecessary deposition of the particles from the target 24 is suppressed. Since the protruding portions 48f, 48g, 48h and 48i are formed at the stage, unnecessary scattering and unnecessary deposition of the particles from the target 24 are suppressed without increasing the number of components.

In one embodiment, the film forming apparatus 10 further includes the wall member 28. Due to the presence of the wall member 28, the width of the path between the slit 14s and the area S22 becomes further reduced. Therefore, the scattering of the particles from the target 24 to the area S22 is further suppressed. In one embodiment, the film forming apparatus 10 further includes the shield member 60. Due to the presence of the shield member 60, the scattering of the particles from the target 24 to the area S22 is further suppressed. Even when the film forming process is performed in a state where the stage 18 is not positioned in the moving area S21, the scattering of the particles from the target 24 to the area S22 is suppressed by the shield member 60.

Figure 8:
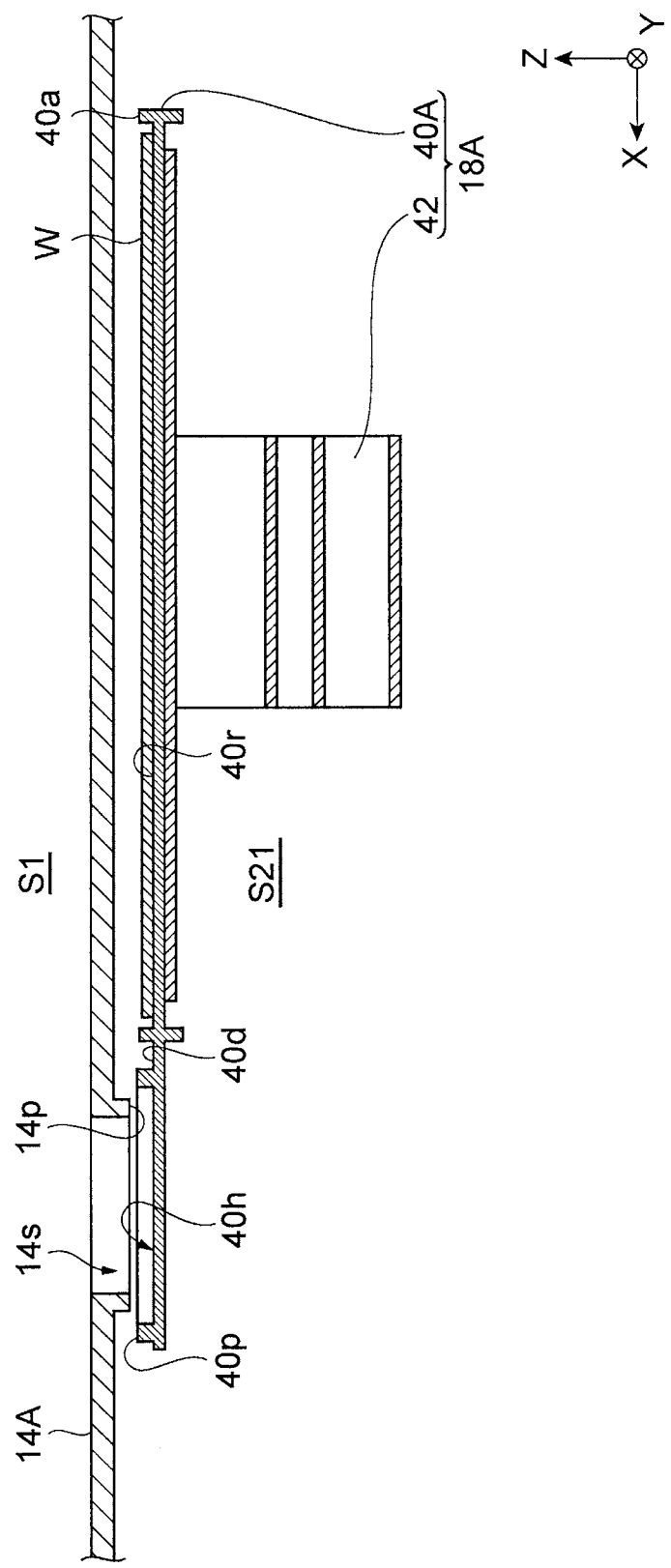
FIGS. 8 and 9 are cross sectional views of a stage and a slit plate in a film forming apparatus according to another embodiment.
Figure 9:
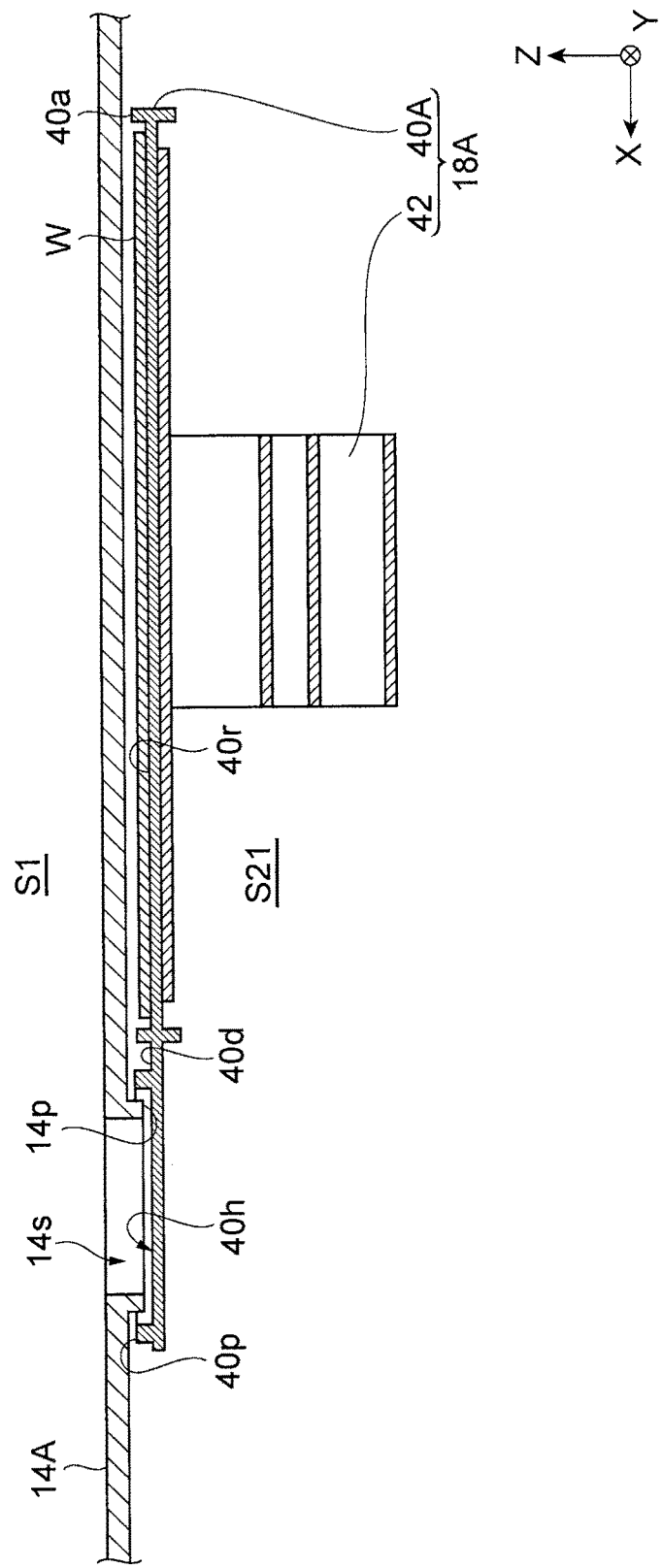

Hereinafter, a film forming apparatus according to another embodiment will be described with reference to FIGS. 8 and 9. FIGS. 8 and 9 are cross sectional views showing a stage and a slit plate in the film forming apparatus according to another embodiment. The film forming apparatus according to another embodiment is different from the film forming apparatus 10 in configurations of a slit plate 14A and a mounting portion 40A of a stage 18A.

As shown in FIGS. 8 and 9, the mounting portion 40A has a region 40d in addition to the mounting region 40r. The region 40d is different from the mounting region 40r and disposed at one side of the mounting region 40r in the X direction. A protruding portion 40p (second protruding portion) protruding upward is formed at the region 40d. The protruding portion 40p extends to define a recess 40h (second recess) at an inner side thereof. In other words, the protruding portion 40p has a frame shape surrounding the recess 40h. When the stage 18 is positioned in the moving area S21 and the recess 40h faces the slit 14s, a top surface of the protruding portion 40p faces a surface of the slit plate 14 around the slit 14s. Due to the presence of the protruding portion 40p, when the particles are released from the target 24 before the substrate W is positioned directly below the slit 14s, it is possible to suppress the scattering of the particles from the target 24 from an area surrounded by the protruding portion 40p to an outer side. Accordingly, it is possible to suppress the scattering of the particles from the target 24 to another area other than the moving area S21 in the second space S2.

In one embodiment, the slit plate 14 may further include a protruding portion 14p (third protruding portion). The protruding portion 14p extends along the edge of the slit 14s and protrudes downward. Maximum widths in the X direction and the Y direction of the protruding portion 14p are respectively smaller than maximum widths in the X direction and the Y direction of the recess 40h. In this embodiment, as shown in FIG. 8, the stage 18 is positioned in the moving area S21 so that the recess 40h can face the slit 14s. Then, the stage 18 is moved upward by the moving mechanism 20 so that the protruding portion 14p is inserted into the recess 40h. Therefore, it is possible to further suppress the scattering of the particles from the target 24 from the area surrounded by the protruding portion 40p to the outer side. Accordingly, it is possible to further suppress the scattering of the particles from the target 24 to another area other than the moving area S21 in the second space S2.

The film forming apparatus described with reference to FIGS. 8 and 9 may not include the wall member 28, the cover unit 32, the driving shaft 34 and the driving device 36. In the film forming apparatus described with reference to FIGS. 8 and 9, the structures shown in FIGS. 1 to 3 may not be employed as long as the supporting portion 42 of the stage 18 supports the mounting portion 40 and is coupled to the other end portion of the multi-joint arm 20c of the moving mechanism 20.

While the embodiments have been described, the present disclosure may be variously modified without being limited thereto. For example, the film forming apparatus of the above embodiments has a single target. However, the film forming apparatus may have one or more targets.

While the disclosure has been shown and described with respect to the embodiments, it will be understood by those skilled in the art that various changes and modifications may be made without departing from the scope of the disclosure as defined in the following claims.

What is claimed is:
1. A film forming apparatus, comprising:
a chamber main body defining a chamber;
a slit plate configured to partition the chamber into a first space and a second space below the first space, the slit plate having a slit penetrating therethrough;
a holder configured to hold a target in the first space;
a stage configured to support a substrate to be processed by the film forming apparatus, wherein the stage is movable along a path in a first horizontal direction which is perpendicular to a longitudinal direction of the slit and the path is disposed in a moving area including an area directly below the slit;
a moving mechanism configured to move the stage along the path,
wherein the stage comprises one or more protruding portions configured to suppress scattering of particles from the target to another area other than the moving area in the second space through the slit, the one or more protruding portions comprise a first protruding portion which linearly extends to the first horizontal direction so as to provide at least one of a upwardly bent portion and a downwardly bent portion along at least a portion of the path provided between said moving area and said another area in the second space; and a wall member coupled to the slit plate to define said moving area and provided between said moving area and said another area in the second space, wherein the wall member has a portion providing a first recess into which the first protruding portion is inserted.

2. The film forming apparatus of claim 1, wherein the stage includes:

a mounting portion having a mounting region on which the substrate is mounted; and a supporting portion configured to support the mounting portion, the supporting portion extending under the mounting portion to be coupled to the moving mechanism.

3. The film forming apparatus of claim 2, wherein the first protruding portion is formed at the supporting portion.

4. The film forming apparatus of claim 1, further comprising:

a shield member provided in the moving area to extend in parallel with the slit, wherein the supporting portion has a hollow portion where the shield member is positioned during movement of the stage in the moving area.

5. The film forming apparatus of claim 1, wherein the wall member provides, at one end in the first horizontal direction, an opening through which the stage is moved into and retreated from the moving area, and wherein the film forming apparatus further comprises a cover unit configured to open and close the opening.

6. The film forming apparatus of claim 4, wherein the wall member provides, at one end in the first horizontal direction, an opening through which the stage is moved into and retreated from the moving area, and wherein the film forming apparatus further comprises a cover unit configured to open and close the opening.

7. The film forming apparatus of claim 2, wherein the one or more protruding portions further comprise a second protruding portion formed at a region in the mounting portion which is different from the mounting region, wherein the second protruding portion extends to define a second recess at an inner side thereof, and wherein when the stage is positioned such that the second recess faces the slit, a top surface of the second protruding portion faces a surface of the slit plate around the slit.

8. The film forming apparatus of claim 7, wherein the slit plate includes a third protruding portion extending along an edge of the slit and protruding downward, and wherein when the stage is positioned such that the second recess faces the slit, the moving mechanism is configured to move the stage upward to insert the third protruding portion into the second recess.

* * * * *